United States Patent [19]

Blaum et al.

[11] Patent Number: 5,778,011

[45] Date of Patent: Jul. 7, 1998

[54] METHOD AND APPARATUS FOR WRITING AND PROTECTING AGAINST RANDOM AND CLUSTER ERRORS IN IMAGE BLOCKS

[75] Inventors: Mario Blaum, San Jose; Jehoshua Bruck, La Canada, both of Calif.; Florian Pestoni, Buenos Aires; Felix Gustavo Emilio Safar, La Plata, both of Argentina; Jorge L. C. Sanz, Urbana, Ill.

[73] Assignee: International Business Machines Corporation, Armonk, N.Y.

[21] Appl. No.: 476,517

[22] Filed: Jun. 7, 1995

[51] Int. Cl.$^6$ .................................... H03M 13/00
[52] U.S. Cl. ........................... 371/37.4; 371/37.1
[58] Field of Search ..................... 371/37.1, 37.4, 371/37.5, 37.9, 38.1, 39.1; 382/321, 317; 235/456

[56] References Cited

U.S. PATENT DOCUMENTS

| 3,831,143 | 8/1974 | Trafton | 371/37.4 |
|---|---|---|---|
| 4,728,783 | 3/1988 | Brass et al. | 235/456 |
| 4,882,732 | 11/1989 | Kaminaga | 371/37.1 |
| 4,924,078 | 5/1990 | Sant'Anselmo et al. | 235/494 |
| 5,140,596 | 8/1992 | Weldon, Jr. | 371/39.1 |
| 5,153,928 | 10/1992 | Iizuka | 382/65 |
| 5,473,443 | 12/1995 | Wilkinson | 358/336 |
| 5,543,937 | 8/1996 | Hamai et al. | 358/341 |

FOREIGN PATENT DOCUMENTS

2218240A  8/1989  United Kingdom.

OTHER PUBLICATIONS

Wang, "Optimal Correspondence of String Subsequences", IEE Transactions on Pattern Analysis and Machine Intelligence, vol. 12, No. 11, Nov. 1990.
Pavlidis, "Fundamentals of Bar Code Information Theory", IEE, Computer, Apr. 1990.
Pavlidis, "Information Encoding with Two-Dimensional bar Codes", IEE, Computer, Jun. 1992.

*Primary Examiner*—Reba I. Elmore
*Assistant Examiner*—Thomas E. Brown
*Attorney, Agent, or Firm*—Baker, Maxham, Jester & Meador

[57] ABSTRACT

A method and apparatus for encoding and detecting data which can be represented in a physical array of modules recorded on a medium. Information is encoded in "image-blocks". An image-block comprises a plurality of "sub-blocks". Sub-blocks comprise a plurality of "modules". A module is the smallest unit of information within the image-block. Discrete contiguous portions of each sub-block of an image-block taken together are encoded into an outer codeword. A plurality of these outer codewords are generated and recorded across each sub-block. A portion of the information that is to be recorded within each sub-block is encoded in a plurality of inner error detection and correction codewords, each preferably stored entirely within one corresponding sub-block. Accordingly, small scattered random errors can be corrected locally by using information entirely contained within the sub-block. If a large area within a sub-block is corrupted, the information contained in each other sub-block may be used to reconstruct the data that was recorded in the corrupted sub-block. The inner codewords are "interleaved" to provide a maximum distance between parts of the same codeword.

14 Claims, 10 Drawing Sheets

METHOD AND APPARATUS FOR WRITING AND PROTECTING AGAINST RANDOM AND CLUSTER ERRORS IN IMAGE BLOCKS

BACKGROUND OF THE INVENTION

1. Field of the Invention

The present invention relates to error detection and correction by a computer, and more particularly to a method and apparatus for encoding data in a physical array of modules recorded on a medium to enhance error detection and correction.

2. Discussion of the Related Art

The advantage of being able to encode data such that the content of the data may be ascertained by a computer is generally well known. For example, "bar codes" comprised a plurality of dark and light vertical lines of predetermined width and separation. Bar codes may be used to encode information, such as a Universal Product Code (UPC). UPCs are commonly printed on products sold in retail markets. A UPC printed on a product encodes an 11 digit value. Bar codes may be "scanned" by an input device when a product is purchased. Once scanned, the information encoded in the bar code is ascertained by a processor coupled to the scanning device. Once scanned, the value encoded in the UPC can be cross referenced to a data file the includes information such as a product name, price, manufacturer, weight, inventory data and expiration date. This information can then be accessed and used by a computer at the time a product is sold. In this way, a running inventory of on hand stock can be maintained. In addition, statistical data regarding purchasing trends can be tracked.

Bar codes are also used on the cover sheet of patents issued by the U. S. Patent and Trademark Office. Encoding information in a bar code is finding increasingly more uses as people consider the implications of this technology.

One disadvantage of the bar code technology is the inherent limitation on the density of the data that can be encoded in a bar code. That is, it is difficult to increase the recording density due to the structure of bar codes. One technique that has been used to increase the density of information carried in a printed code replaces the bar code with a "two dimensional print code". For example, U.S. Pat. No. 5,153,928, issued to Iizuka on Oct. 6, 1992, teaches the use of a two dimensional print code. The two dimensional print code taught by Iizuka includes a plurality of modules aligned in a two dimensional array, as shown in FIG. 1. The relative shading of each generally square module 25 indicates whether a data bit represented by that module 25 is a logical one or a logical zero. An image sensor (such as a CCD sensor element array) is manually moved across the two dimensional print code in order to detect the shading of each module 25. That is, sensor elements in the sensor array photoelectrically convert input light (i.e., light reflected by the black and white pattern of modules on the recording medium facing the sensor elements) into analog image output signals. Analog image output signals from the sensor elements are coupled through an analog multiplexer which generates a line image output for all of the sensor elements of the sensor array. Accordingly, a binary data structure can be generated which indicates the relative state of each module in the two dimensional print code. Two guide lines 21 are printed parallel to each other in order to aid in determining the physical dimensions of the array. In addition, a pattern of "start marks" 23 are included in the two dimensional print code.

As with all data communication and collection systems, errors can occur in the data. That is, the data written to and read from such a two dimensional print code can be corrupted. For example, when a two dimensional print code is printed on a paper medium, ink spreads or smears may make the value of a module ambiguous or erroneous. In addition, relatively large scale effects, such as ink drops or other contaminants and obstructions which cover portions of the print code, may obscure relatively large portions of a two dimensional print code. Errors may also be caused by defects in the material upon which the print codes are printed. Accordingly, it is desirable to provide a mechanism for sensing and correcting errors that occur during the process of reading or writing the modules of the two dimensional print code. This is particularly important in high density two dimensional print codes, since the number of errors which occur increases as the density of the two dimensional print code increases.

Error detection and correction techniques are known in the art. For example, Iizuka provides error detection and correction capability by adding error correction codes to the data represented by the two dimensional print codes. More specifically, Iizuka describes a method in which product codes are used. After adding the product codes, the entire two dimensional print code is scrambled in order to provide a more robust method for correcting "cluster" errors which affect a plurality of adjacent modules. This approach requires a relatively large number of overhead modules (redundancy modules which to not carry additional information). For example, in one embodiment shown in FIG. 27 of Iizuka, 176 redundancy symbols are required for each 256 data symbols. Furthermore, the scrambling technique used by Iizuka leaves the code vulnerable to multiple small randomly scattered errors.

In light of the demand for an efficient method and apparatus for recording and detecting data in a two dimensional print code, it would be desirable to provide a method and apparatus for recording information in a two dimensional print code which reduces the number of redundancy modules, and which is capable of correcting both small scattered errors and larger clustered errors.

SUMMARY OF THE INVENTION

The present invention is a method and apparatus for encoding and detecting data which can be represented in a physical array of modules recorded on a medium. For example, the present invention is useful for encoding and decoding information in any medium in which data is arranged in a physical array, such as holographic medium, paper, and magnetic medium.

In accordance with one embodiment of the present invention, information is encoded in a physical data array. The data array is generally referred to as an "image-block". Information within a data file may be encoded in a plurality of image-blocks. Alternatively, each image-block may be a separate data file. An image-block comprises a plurality of "sub-blocks". Sub-blocks comprise a plurality of "modules". A module is the smallest unit of information within the image-block. That is, each module preferably represents a single bit of information.

In accordance with one embodiment of the present invention, discrete contiguous portions of each sub-block are taken together and encoded into an outer codeword. For example, in one embodiment of the present invention, a sub-block includes 196 modules configured in a 14×14 array. The modules within the array are grouped in bytes, each byte comprising 6 modules. Each 6 module byte within a sub-block is taken together with one corresponding 6 module byte from each other sub-block to form an "outer" error correction codeword. Accordingly, if the image-block comprises 64 sub-blocks, then the resulting outer error correction codeword would have 64 6-module bytes. If a large area within a sub-block is corrupted, the information contained in each other sub-block may be used to reconstruct the data that was recorded in the corrupted sub-block. In addition, a portion of the information that is to be recorded within each sub-block is encoded in an inner error correction codeword. Each inner error correction codeword preferably stored entirely within one corresponding sub-block. Accordingly, small scattered random errors can be corrected locally by using information entirely contained within the sub-block before the decoding of the outer error correction codewords.

Furthermore, in accordance with the present invention, the inner error correction codewords are "interleaved" to provide a maximum distance between modules of the same codeword. By providing inner codewords capable of correcting numerous small randomly scattered errors, outer codewords capable of correcting errors which occur infrequently over a relatively large area, and interleaving inner codewords, the present invention provides an extremely robust and efficient method and apparatus for encoding and decoding data represented in a two dimensional array.

The details of the present invention, both as to its structure and operation, can best be understood by referring to the accompanying drawings, in which like reference numbers and designations refer to like elements.

DETAILED DESCRIPTION OF THE PREFERRED EMBODIMENTS

Figure 1:
FIG. 1 is an illustration of a prior art two dimensional print code.
Figure 2:
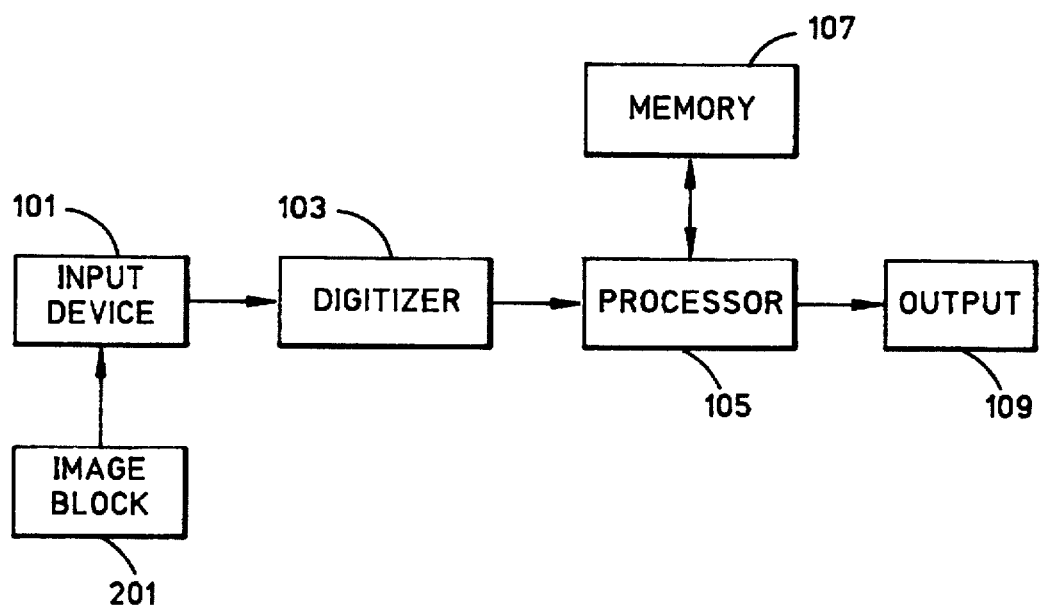
FIG. 2 is a block diagram of one embodiment of the present invention.

The present invention is a method and apparatus for encoding and decoding information in a physical array of modules. Each module preferably represents one bit of information. FIG. 2 is an illustration of one embodiment of the present invention. An input device 101 reads information from an "image-block" 201. The input device 101 may be any conventional device that is capable of generating an output signal that represents a characteristic of a point in space, such as a conventional optical scanner which is capable of representing the amount of light reflected from particular locations on a sheet of paper as an electrical signal. The image-block 201 is any medium which is capable of encoding data by an alteration of a characteristic at a physical location within the medium, such as a two-dimensional print code, a two dimensional magnetic medium, a two-dimensional holographic data structure, or a three dimensional holographic data structure.

If the input device 101 provides an analog signal, then a digitizer 103 converts the analog output from the input device 101 into a digital signal. For example, in one embodiment of the present invention, the input device 101 is a conventional optical scanner that outputs an analog voltage that is proportional to the amount of light reflected from a piece of paper placed in close proximity to the optical scanner. The output signal from the optical scanner is synchronized to a scan signal to indicate the relative location on the image-block 201 associated with the voltage level being output at a particular time. The digitizer 103 receives the output signal from the scanner, determines whether the output represents a logical "0" or "1" and converts the output signal into a digital data stream that can be processed conventionally. The digital data stream output from the digitizer 103 is coupled to a processor 105. The processor 105 is coupled to a conventional memory device 107 and an output device 109, such as a printer, magnetic write head, optical write head, etc. In accordance with the present invention, the processor 105 may be a programmable microprocessor, a state machine, or dedicated hardware. The memory 107 may be any means for storing information, such as magnetic data storage device, random access memory fabricated in a semiconductor integrated circuit, dynamic random access memory, optical memory device, or any other means for storing information.

Figure 3:
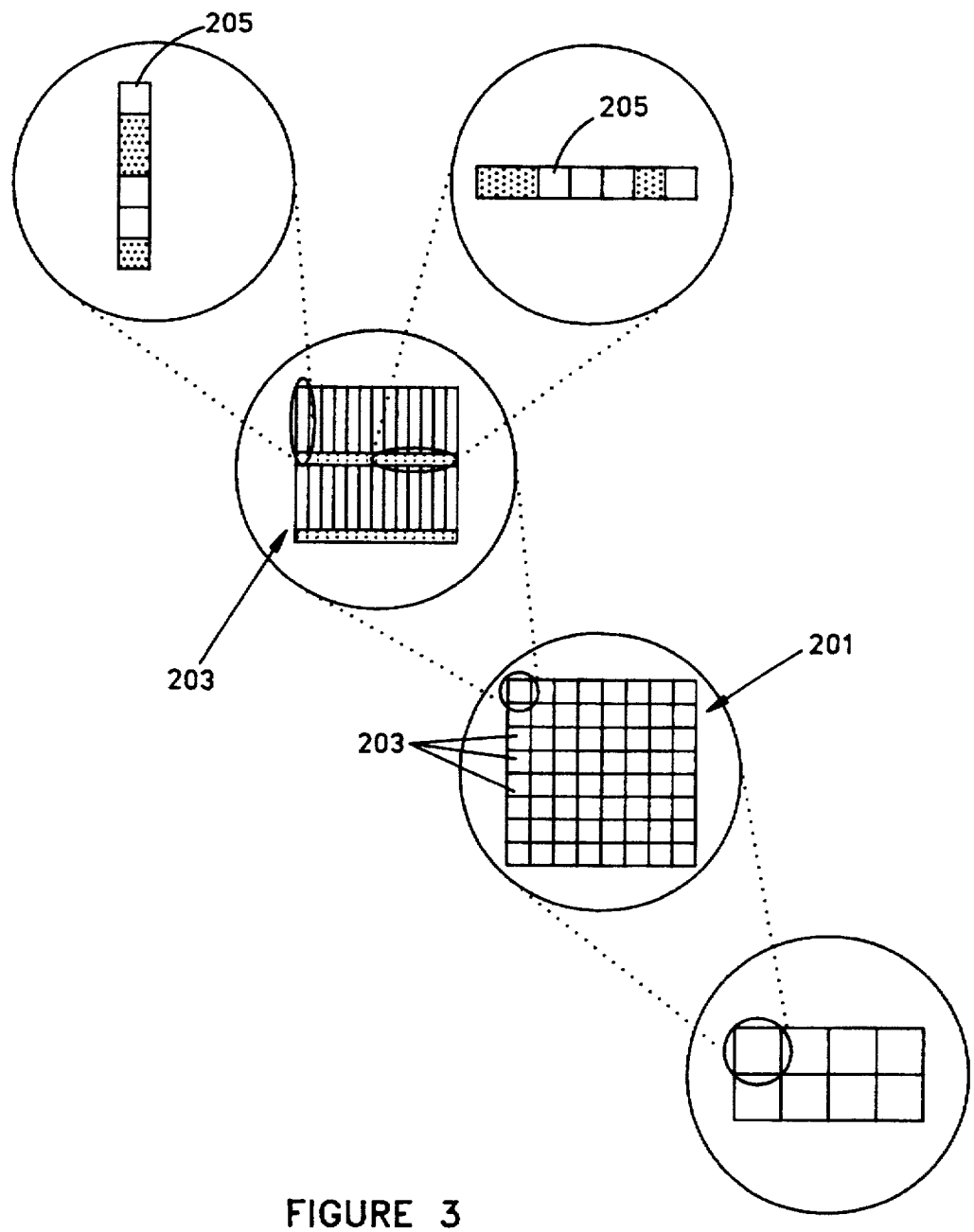
FIG. 3 is an illustration of an image-block comprising a plurality of sub-blocks in which modules are encoded into a plurality of interleaved inner codewords, and showing the relationship between the image-block, sub-blocks, and modules in accordance with one embodiment of the present invention.

FIG. 3 is an illustration of one embodiment of an image-block in accordance with the present invention. The image-block is a two dimensional array in which information is encoded, such as a two-dimensional print code. Print codes communicate information between a print medium, such as paper, and a computer in the manner described above with respect to FIG. 2.

Figure 4:
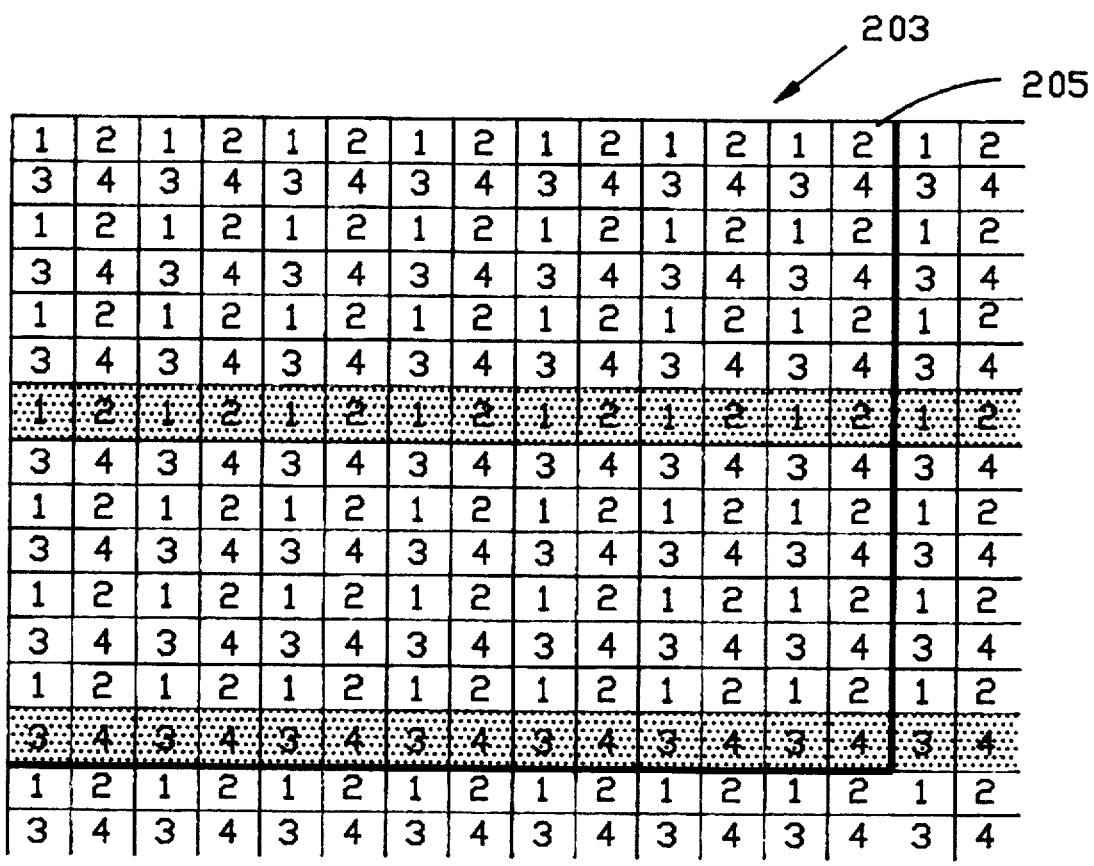
FIG. 4 is an illustration of a sub-block in which bytes of a plurality of inner codewords are interleaved in accordance with one embodiment of the present invention.
Figure 5:
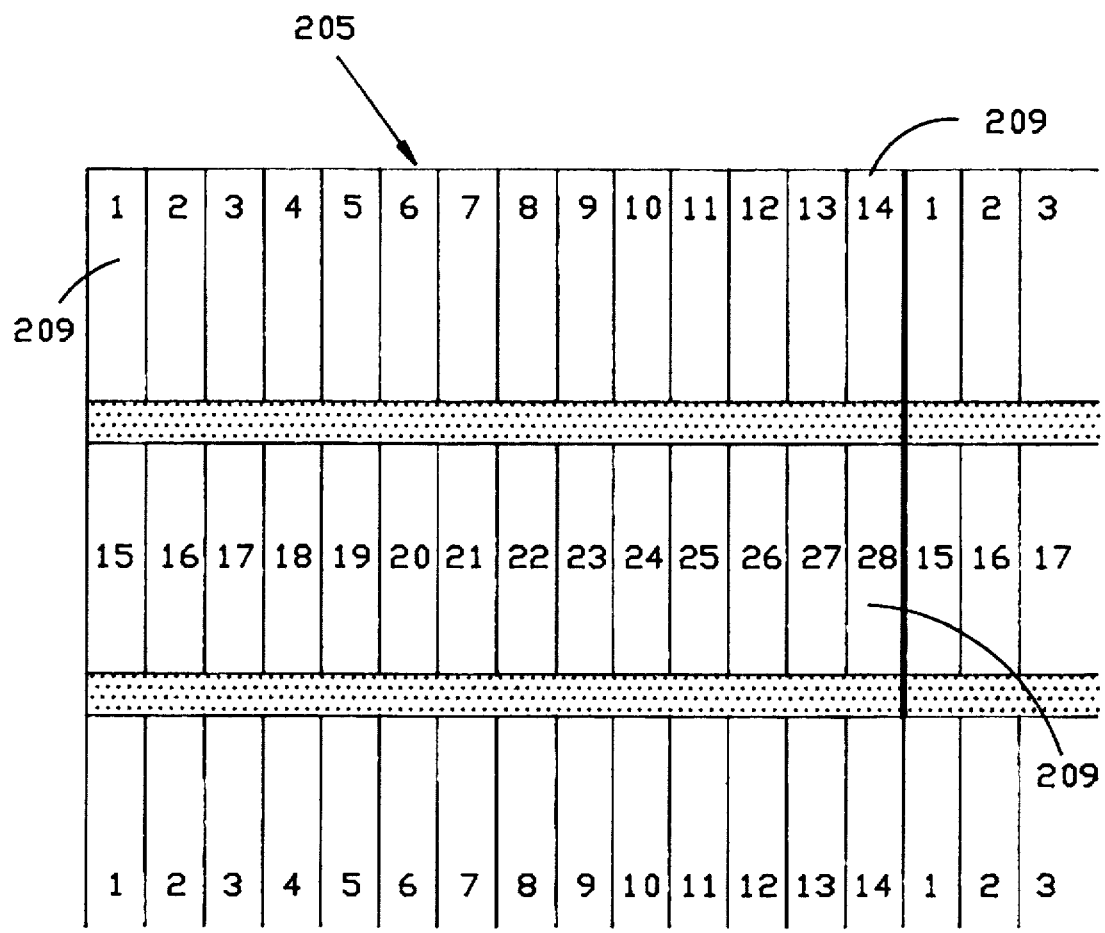
FIG. 5 is an illustration of a sub-block in which bytes of a plurality of outer codewords are interleaved in accordance with one embodiment of the present invention.

In the embodiment shown in FIG. 3, the image-block 201 comprises a plurality of "sub-blocks" 203. In the preferred embodiment of the present invention, the dimensions of each sub-block are identical. Each sub-block 203 preferably comprises a plurality of contiguous modules 205. In particular, the image-block 201 of FIG. 3 has 64 sub-blocks 203. Each sub-block has 196 modules 205 configured in a two-dimensional 14×14 array. FIGS. 4 and 5 illustrate a sub-block 203 in greater detail. In the embodiment illustrated in FIGS. 4 and 5, each of the modules 205 is essentially square. In an alternative embodiment, modules 205 have other predetermined shapes, such as are generally circular, triangular, octagonal, etc. Each of the modules 205 preferably represents one bit of information (i.e., represents one of two states). Alternatively, each module 205 can represent more than one bit. For example, if the two-dimensional image-block of the FIG. 3 is a print code, then each module 205 can be either black or white if each module represents a binary bit of data.

Alternatively, each module 205 may be printed in one color from among a finite set of possible colors where each color represents the state of three binary bits. Accordingly, in one embodiment, red is defined as a member of the set of possible colors and represents a corresponding binary state "010". Since binary states are typically used to represent data within digital computers, the binary states represented by each module 205 of the image-block 201 can be mapped into a unit of data within a data structure stored in a computer. For simplicity, the illustrated embodiments of the present invention have modules 205 that represent binary states. More specifically, each module 205 of the illustrated embodiment is either black or white, where black represents a first logical state, such as "1", and white represents a second logical state, such as "0". Accordingly, the 196 modules 205 shown in FIGS. 4 and 5 can represent 196 binary bits of data. Each image-block 201 can record 12,544 bits of data.

In accordance with the present invention, data that is to be recorded in the image-block 201 is encoded in both "inner codewords" and "outer codewords". The inner codewords may be any of the well-known error correction codewords, such as codewords of a Hamming [49, 42] code. Each inner codeword is preferably completely contained within one sub-block 203 associated with that codeword. In an alternative embodiment, the inner codewords may be recorded in a relatively small number of sub-blocks 203. In the preferred embodiment of the present invention, the information in each sub-block 203 is encoded in more than one inner codeword. The modules that comprise each codeword are "interleaved" within the sub-block 203 in order to provide the most robust error correction system possible. For example, in one embodiment of the present invention in which a Hamming [49, 42] code is used, the codewords are 49 units long in order to convey information that is encoded in 42 of those units. The remaining 7 units carry "redundancy" information that is necessary for error detection and correction. Each of the 49 modules 205 marked "1" is part of the first codeword. Each of the 49 modules 205 marked "2" is part of the second codeword, etc. In the embodiment of the present invention shown in FIGS. 3–5, the seven redundancy modules are preferably located in the 7th and 14th rows (shown in shading in FIGS. 4 and 5). By separating the redundancy information, space can be allocated for the redundancy information when outer codewords are being generated, as will be made clear below. In the case in which a Hamming [49, 42] code is used, the state of a module 205 that has been corrupted can always be recovered if no more than one module from the same codeword is corrupted. Accordingly, the interleaving scheme shown in FIG. 4 allows any one group of four modules 205 which form a 2×2 square within each sub-block 203 to be corrupted without a loss of information.

The use of inner codewords protects data from being lost if relatively small scattered random errors are generally evenly distributed over the entire image-block. That is, data can be recovered using only the inner codewords if no more than one group of 2×2 modules are corrupted within each sub-block 203. It should be clear that any four module that are each from a different codeword can be corrected even if they do not form a 2×2 square. However, the most likely case is that more than one contiguous module will be corrupted at a time. However in many cases, small scattered random errors are likely to only affect four modules at most. That is, a defect that is smaller than one module may affect more than one module by occurring on a border between modules. However, in order to affect more than four modules, the defect must be larger than one module in at least one dimension.

The ability to correct small scattered random errors is advantageous, since a number of small scattered errors can accumulate in codewords that are spread out over relatively large areas, overwhelming the codeword and making it impossible to correct the errors. Because the inner codewords are relatively small (i.e., are spread over relatively little area), fewer errors will occur in each inner codeword. However, if only the inner codewords were provided, a more catastrophic error in which more than four modules 205 are corrupted would cause information to be lost. In addition, in cases in which more than the statistically predicted number of small scattered errors occur in any one codeword, data could be lost. In accordance with one embodiment of the present invention, a second level of protection is provided by the outer codewords to prevent such losses. The outer codewords allow larger cluster errors (i.e., errors as large as one entire sub-block) to be corrected.

FIG. 5 illustrates the way the outer codewords are interleaved among a plurality of sub-blocks 203 in accordance with one embodiment of the present invention. Each set of six modules (marked "1" through "28") form one byte 209 of a unique outer codeword. Accordingly, in the embodiment of the present invention shown in FIG. 5, there are 28 outer codewords in the image-block 201. In accordance with the illustrated embodiment, each of the 28 codewords is a Reed-Solomon code having 64 six-module bytes. One six-module byte from each of the 28 codewords is located in each of the 64 sub-blocks 203 of the image-block 201. By providing an outer codeword, the information in each of the other 63 sub-blocks 203 can be used to recover the corrupted information, even if a relatively large number of modules (or all) of the modules in any one of the sub-blocks 203 is corrupted. The inner codewords work together with the outer codewords to provide a system in which small scattered errors which generally occur relatively frequently can first be corrected using the inner codewords. Once the inner codewords are used to recover from the small scattered errors, outer codewords are be used to recover information that is corrupted by larger, but less frequent errors. A 64 byte long codeword carries 62 bytes of data and 2 bytes of redundancy information. Therefore, in accordance with the illustrated embodiment of the present invention shown in FIGS. 3–5, an image-block 201 can hold up to 28×6×62 modules of data, since there are 28 six-module bytes in each of the 62 sub-blocks 203 that hold non-redundancy information. Accordingly, a 10 Kbyte file can be encoded using 8 image-blocks 201 arranged in an array of 2×4 modules, as shown in FIG. 3.

Figure 6:
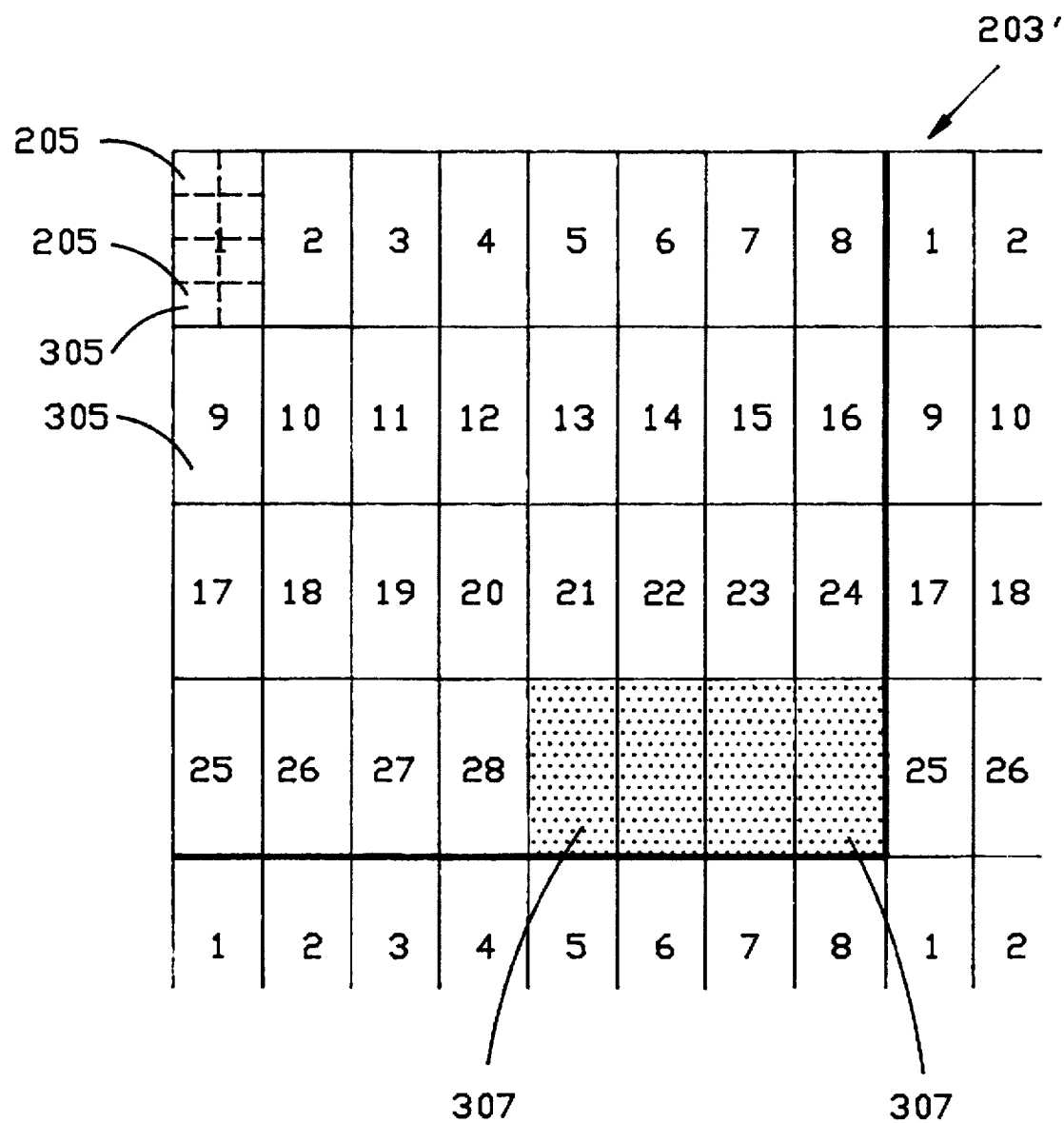
FIG. 6 is an illustration of a sub-block in accordance with another embodiment of the present invention, in which outer Reed-Solomon codewords are interleaved.
Figure 7:
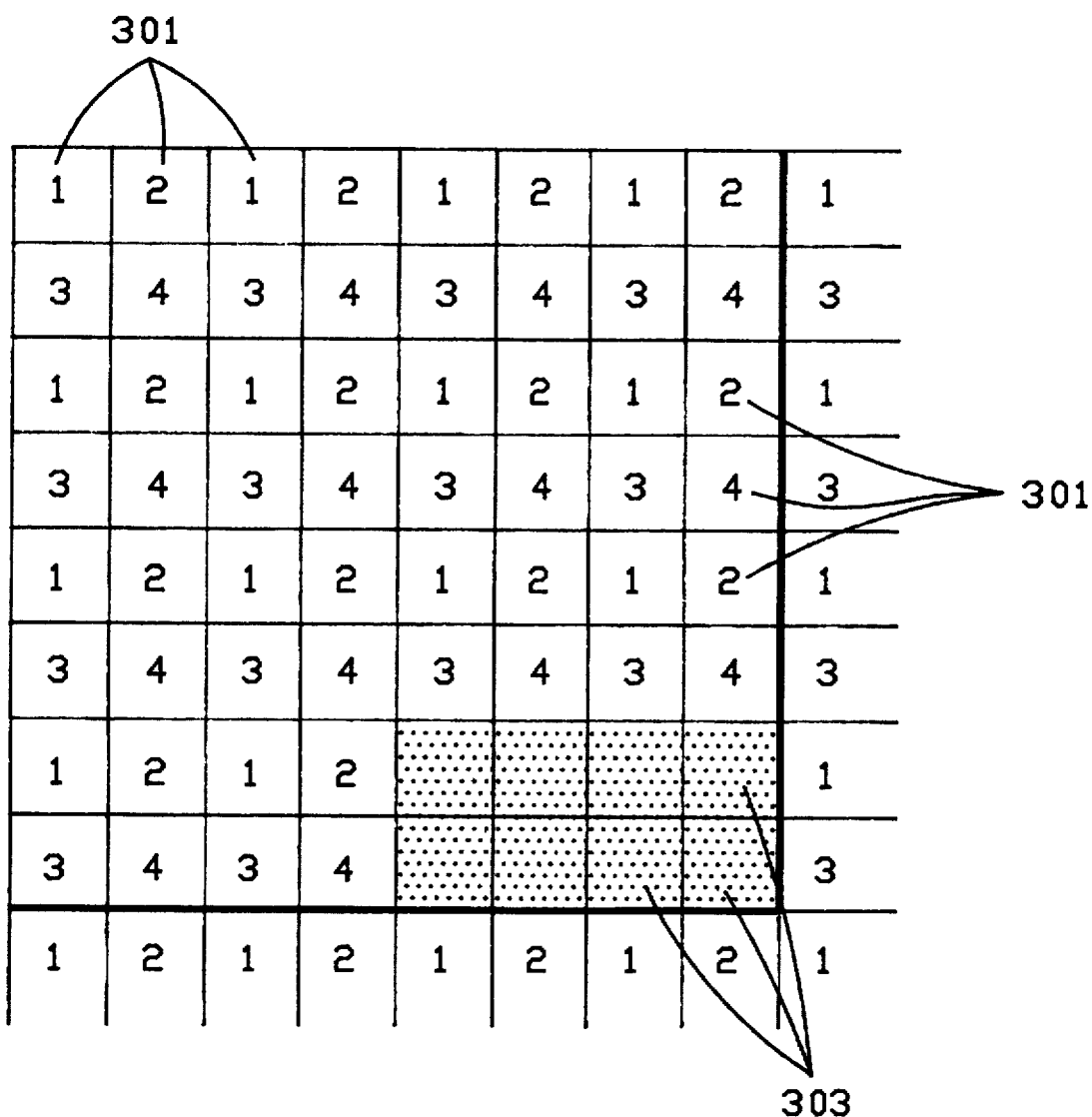
FIG. 7 is an illustration of the sub-block of FIG. 6 in which inner Reed-Solomon codewords are interleaved in accordance with one embodiment of the present invention.
Figure 8:
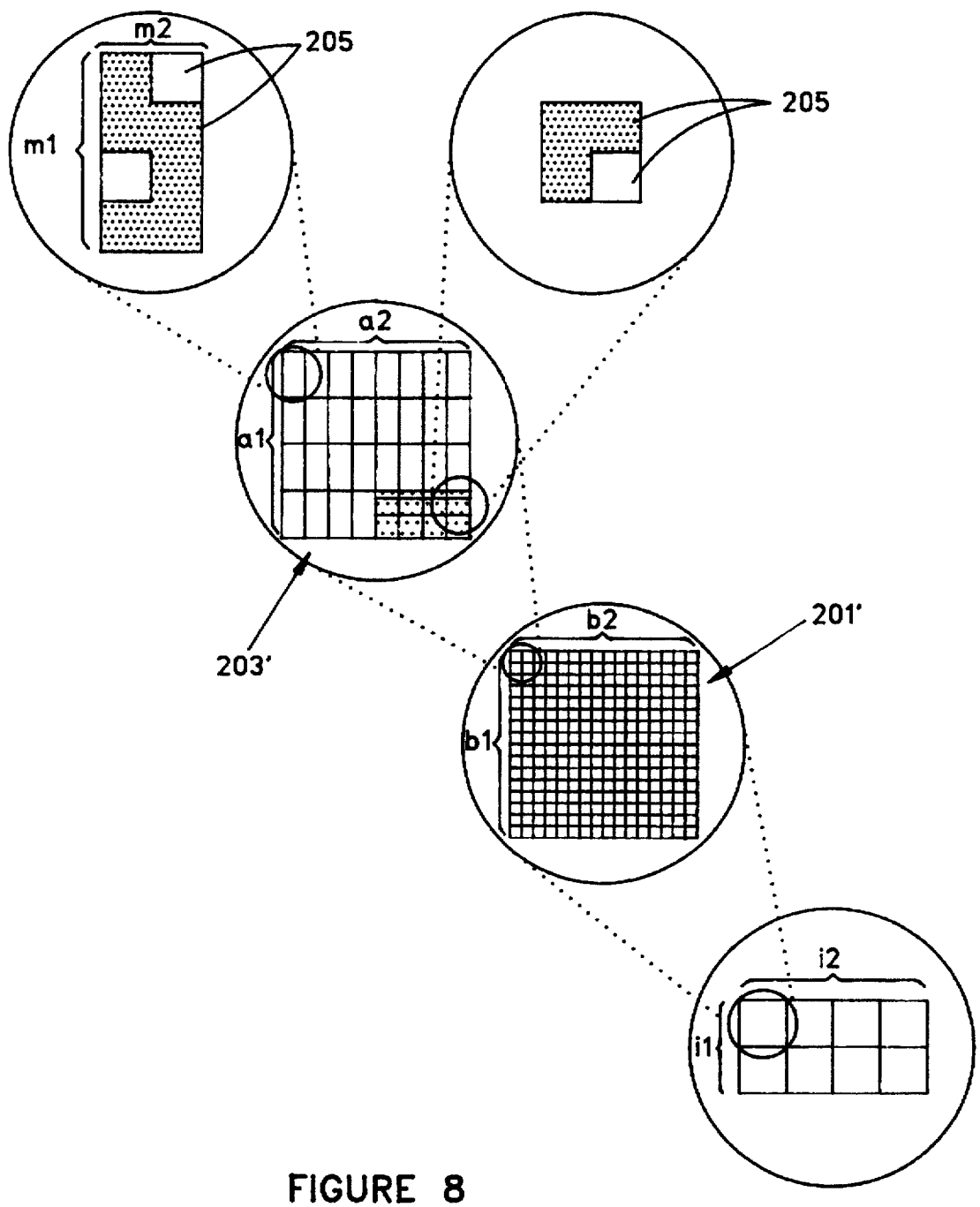
FIG. 8 is an illustration of an image-block comprising the sub-blocks of FIGS. 6 and 7, and showing the relationship between the image-block, sub-blocks, and modules.

In one alternative embodiment of the present invention shown in FIGS. 6–8, both the inner and outer codewords are Reed-Solomon codes. For example, FIG. 6 shows each sub-block 203' as having, 28 bytes 305, each byte 305 being an array of 2×4 modules. The sub-block 203' is a 16×16 module array. Each of these bytes 305 is associated with a unique outer codeword. Each outer codeword is preferably a Reed-Solomon [256, 254] codeword over the Galois field GF ($2^8$).

A section of each sub-block 203' (such as the 4 bytes 307 shown in shading in the bottom right corner of FIG. 6) is reserved for the redundancy information for an inner Reed-Solomon codeword. For example, in the embodiment of the present invention shown in FIG. 7, the 256 modules 205 in each sub-block 203' are viewed as sixty-four 2×2 arrays 301. Each 2×2 array 301 represents a 4-module byte of a Reed-Solomon code in the Galois field GF ($2^4$). The data in each of the 2×2 arrays 301 is encoded into 4 Reed-Solomon |16, 14| (extended) codewords. The two redundancy bytes (i.e., two redundancy symbols in 2×2 module arrays) of each of the 4 four codewords are recorded in the array of 4×8 modules 303 located in the bottom right corner of the sub-block 203' (shaded area of FIGS. 6 and 7). Each of the other bytes 301 of the four inner codewords are interleaved as shown in FIG. 7, such that any group of inner codeword bytes 301 that form a 2×2 square includes one byte 301 from each of the four inner codewords. That is, each byte 301 marked "1" in FIG. 7 is part of the first inner codeword, each byte 301 marked "2" is part of the second inner codeword, etc. Accordingly, the bytes of each inner codeword are spaced apart from each of the other bytes of the same inner codeword. As illustrated in FIG. 8, each image-block 201' includes an array of 16×16 sub-blocks 203'. An image-block 201' includes 28 outer codewords (as best seen in FIG. 5). Each of the 28 outer codewords has a total length of 16×16×2×4 modules (i.e., one 2×4 module byte in each of the 16×16 sub-blocks).

Figure 9A:
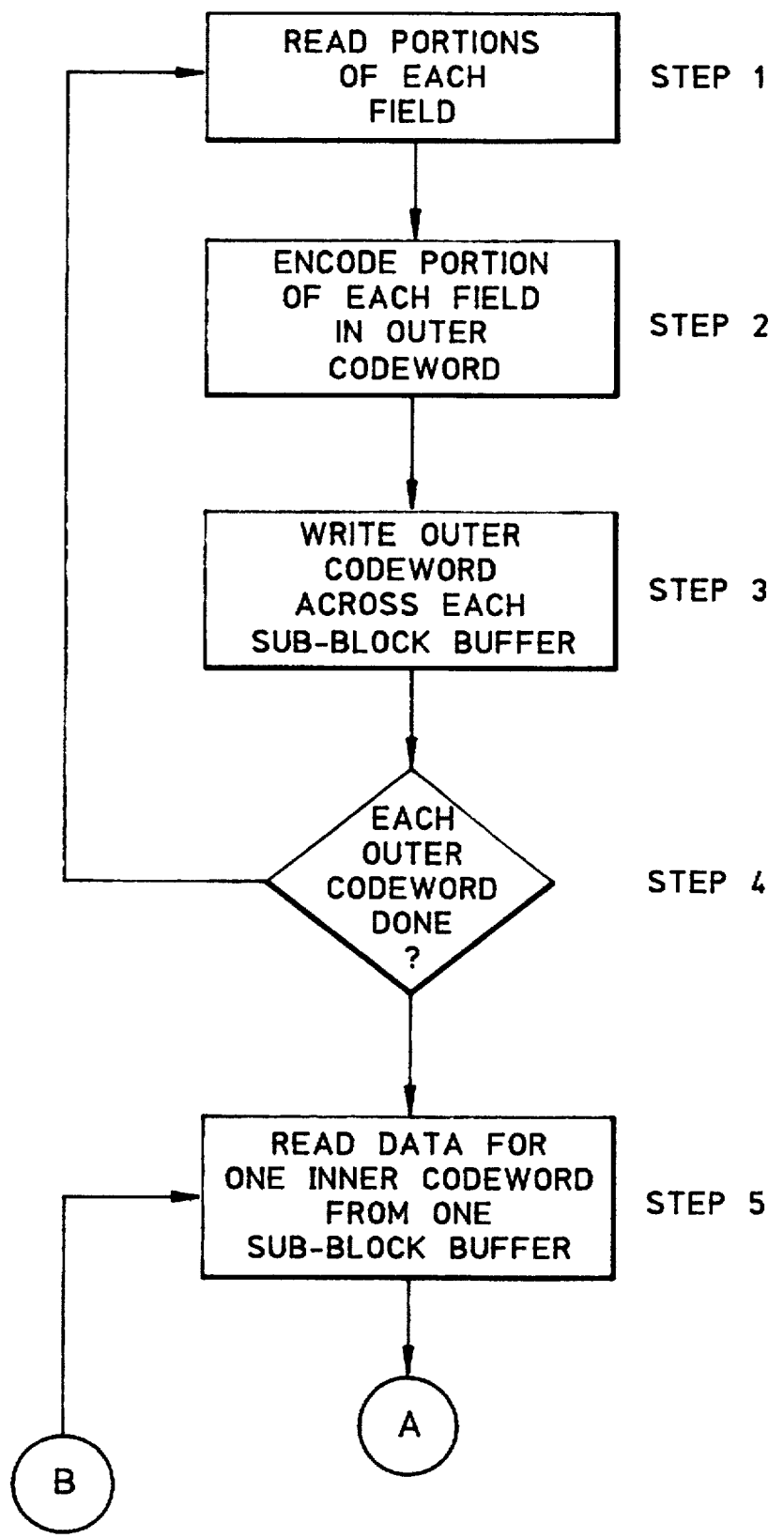
FIGS. 9a and 9b are flowcharts of one embodiment of the inventive method of the present invention.
Figure 9B:
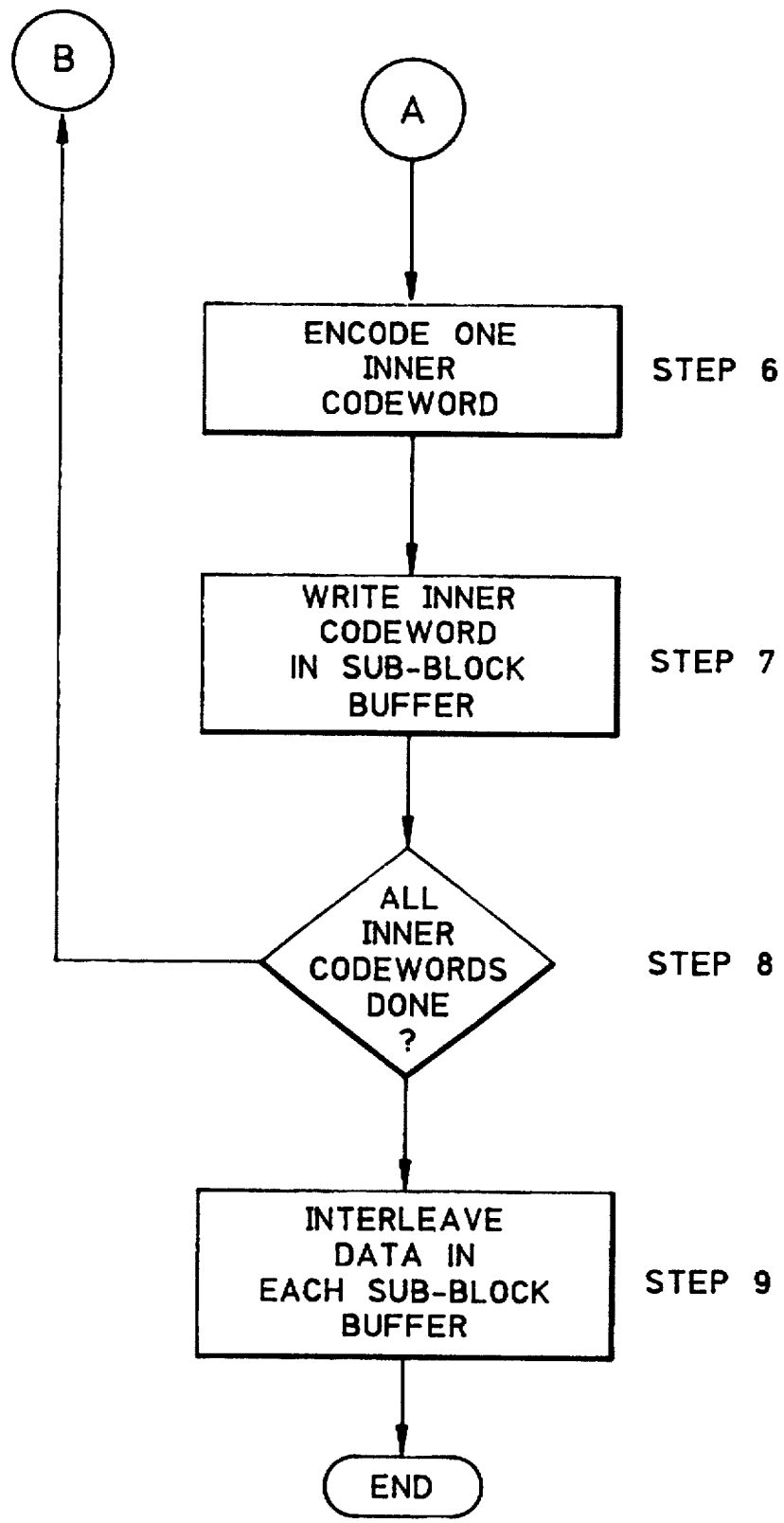
Figure 10:
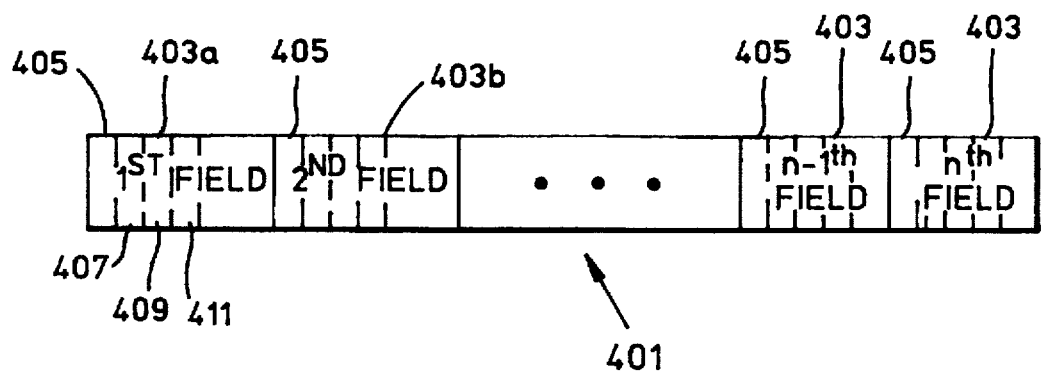
FIG. 10 is an illustration of a data file in accordance with one embodiment of the present invention.
Figure 11:
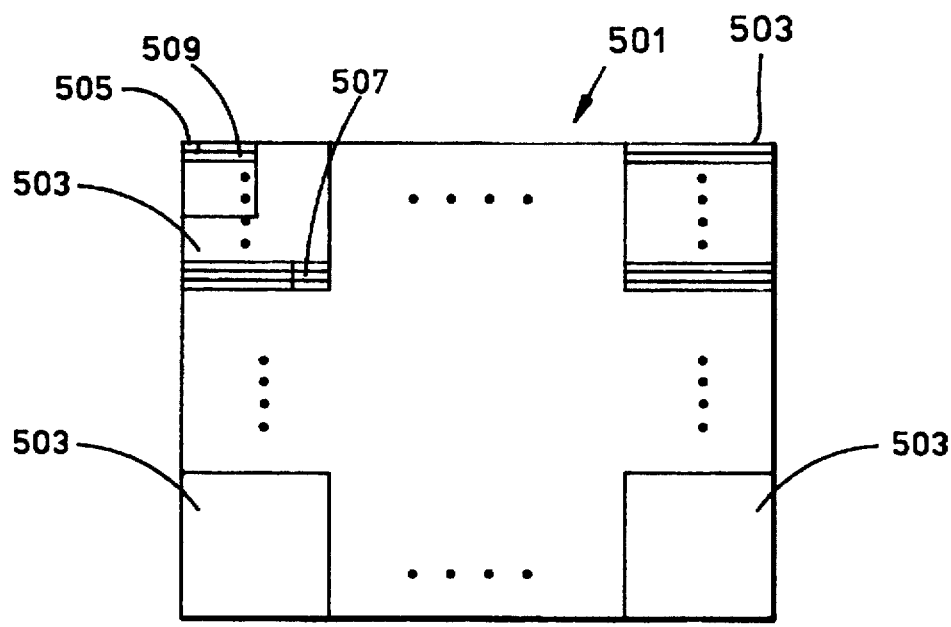
FIG. 11 is an illustration of an image-block buffer in accordance with one embodiment of the present invention.

A flowchart of the steps performed in accordance with one embodiment of the inventive method in which data is encoded and printed in a two dimensional print code is provided in FIGS. 9a and 9b. FIG. 10 is an illustration of a data file 401 stored in memory 107. FIG. 11 is an illustration of an image-block buffer 501 in accordance with one embodiment of the present invention. In one embodiment of the present invention, the image-block buffer 501 resides within memory 107. In accordance with the process illustrated in FIGS. 9a and 9b, data to be encoded is already present in a data file 401 in memory 107 and is accessible to the processor 105. In one embodiment of the present invention, the data to be recorded is stored sequentially in fields 403 within the data file 401. The data to be recorded in a first sub-block 203, 203' lies within a first field 403a at the beginning of the data file (i.e., at the lower addresses), the data to be recorded in a second sub-block 203, 203' lies in a second field 403b at the next block of addresses, etc. Data may be input into the memory by any conventional means, such as from a keyboard, optical scanner, or data storage device.

In a first step, data within a sub-field 405 of the first field 403a is read by the processor 105 from the memory 107. The sub-field data is then taken together with data from other similar sub-fields 405 of each other field 403 in the memory 107 (STEP 1). In one embodiment of the present invention, each sub-field 405 is equal in size to one symbol of the outer codeword to be generated in accordance with a conventional error correction coding method, such as Reed-Solomon encoding. The data read from each sub-field 405 is taken together and encoded into one outer codeword (STEP 2). It will be understood by those skilled in the art, that any error correction method may be used to encode the data into codewords. Two examples are provided above (i.e., Reed-Solomon, Bose-Chadhuri-Hocquenghem (BCH), and Hamming codes). However, other error correction methods are applicable to the present invention. For example, U.S. Pat. No. 5,321,246, issued to Blaum, et al. and assigned to the assignee of the present application, and *Error Control Coding*, by Lin and Costello, Published by Prentice Hall 1983, are incorporated by reference herein, provide examples of additional error correction codes.

The outer codeword generated in STEP 2 is stored in the image-block buffer 501 (STEP 3). In one embodiment of the present invention, the image-block buffer 501 preferably has the same configuration and size as the image-block 201 into which the data is to be recorded. Accordingly, the image-block buffer 501 is divided into a plurality of sub-block buffers 503. The outer codeword is recorded across a plurality of the sub-blocks buffer 503. In accordance with one embodiment, each outer codeword can be divided into a plurality of sub-words (such as symbols or bytes). In one embodiment of the present invention, the number of sub-words within each outer codeword is equal to the number of sub-block buffers 503 within one image-block buffer 501. One sub-word 505 of the outer codeword is stored in each sub-block buffer 503 of the image-block buffer 501. STEPs 1 through 3 are repeated for each additional group of sub-fields 407, 409, 411 until all of the data in the data file 401 has been encoded into outer codewords (STEP 4).

Next, a portion 509 of the data stored in one sub-block buffer 503 of the image buffer 501 is read by the processor 105 (STEP 5). In one embodiment of the present invention, the portion 509 of the data read from the sub-block buffer 503 includes a plurality of the sub-words 505 of various outer codewords stored in one sub-block buffer 503. The amount of data read is equal to the amount of data to be encoded in one inner codeword. In one embodiment of the present invention, the boundaries that separate the sub-words 505 of the outer codewords recorded in the sub-block buffers 503 are not taken into account in selecting the portion 509 of data to be encoded into the inner codewords. Alternatively, the portion 509 of data is an integer multiple of the sub-words 505 stored in the sub-block 503, with boundaries that are coincident with the boundaries of the sub-words 505 included therein.

The portion 509 of data read in STEP 5 is then encoded into a first inner codeword (STEP 6). The inner codeword is recorded in the sub-block buffer 503 (STEP 7). In one embodiment of the present invention, the inner codeword overwrites the outer codeword data that was encoded into the inner codeword. However, it should be noted that the addition of the redundancy generated by the inner codeword will cause the inner codeword to be larger than the portion 509. Accordingly, when setting the dimensions of the image-block buffer, a section 507 of each sub-block buffer is preferably allocated and reserved for storing the inner codeword redundancy information.

In the preferred embodiment of the present invention, a plurality of portions 509 are encoded into inner codewords and recorded in each sub-block buffer 503. Each inner codeword is preferably recorded entirely within one sub-block buffer 503. Alternatively, inner codewords may be spread over a plurality of sub-block buffers 503. However, the greater difference between the area over which an inner codeword is spread and the area over which an outer codeword is spread, the better the present invention will be able to distinguish between and correct both small scattered errors and large cluster errors. That is, in the preferred embodiment of the present invention, the inner codewords are recorded over a relatively small area (i.e., one sub-block) which makes the inner codewords well-suited to correcting small scattered random errors. The outer codewords are recorded over a relatively large area (i.e., spread over entire image-block), which makes the outer codewords well-suited to correcting larger cluster errors.

After recording the inner codeword in the sub-block buffer 503, STEPs 5 through 7 are repeated if not all of the outer codewords have been encoded into an inner codeword (STEP 8). This process repeats until each inner codeword for each sub-block has been generated. Once all of the data in each sub-block buffer 503 has been encoded into an inner codeword, sub-words (such as individual symbols) of each inner codeword are preferably interleaved with sub-words of other inner codeword from the same sub-block (see FIGS. 4 and 7) (STEP 9). By interleaving sub-words of each inner codeword with sub-words of each other inner codeword from the same sub-block, the sub-words of each inner codeword are preferably spread evenly over the entire area of the sub-block. Therefore, there is a greater chance that no more than a single sub-word of each inner codeword will be corrupted by a scattered random error. Accordingly, there is a greater chance that the error will be correctable using only the inner codewords. In an alternative embodiment of the present invention, the step of interleaving the inner codewords is performed immediately after each of the inner codeword of one sub-block have been generated.

From the above description of the present invention, it will be clear to one skilled in the art that the present invention provides a method and apparatus for encoding data in a two dimensional array format, such that both small scattered random errors and large cluster errors can be corrected with a minimum amount of overhead. That is, in the example provided in FIGS. 5–7, the present invention can recover from errors in one module in each of the four inner codewords recorded in each sub-block. Accordingly, upto 256 scattered errors can be corrected by adding 512 additional modules to the image-block 201. It will be clear to those skilled in the art that additional redundancy will provide additional error correction capability. The optimum redundancy and encoding technique is best determined on a case by case basis. Once scattered small errors have been corrected by using the inner codewords, the outer codewords are used to correct large cluster errors in which a large area of a particular sub-block has been corrupted. That is, returning to the example provided in FIGS. 5–7, one entire sub-block 203 can be recovered assuming that any other errors in each other sub-block can be recovered using the inner codewords. Of course, more than one cluster error can be corrected if each is smaller than one sub-block, as long as no more than the number of errors that can be recovered in one codeword have occurred in the symbols of any one codeword.

It will be clear to one of ordinary skill in the art that the process of reading data from an image-block will be the reverse of the process described above and illustrated in FIGS. 9a and 9b. That is, the information that is encoded in an image block is read into an image block buffer. The inner codewords are decoded first and stored back in the image buffer. Any scattered random errors that are detected by the inner codewords are corrected if they are sufficiently small. Once each of the inner codewords has been decoded (if possible), the first outer codeword can be decoded (if possible). Since the inner codewords have already corrected any scattered random error that may have been present, the outer codewords have been improved by the error detection and correction feature of the inner codewords. The result of decoding each outer codeword is stored in the image buffer. Each other codeword is decoded in the same manner until all of the outer codewords have been decoded.

A number of embodiments of the present invention have been described. Nevertheless, it will be understood that various modifications may be made without departing from the spirit and scope of the invention. For example, the present invention is described as using a "processor" and a "memory". In accordance with the present invention, the processor may be a programmable microprocessor, a state machine, or dedicated hardware. The memory may be any means for storing information, such as magnetic data storage device, random access memory fabricated in a semiconductor integrated circuit, dynamic random access memory, optical memory device, or any other means for storing information. Furthermore, any error correction code may be used to encode data in a codeword. Still furthermore, an image-block in accordance with the present invention may have any dimensions and may have any number of sub-blocks. Each sub-block may include any number of inner codewords. Furthermore, the image-block may have any number of outer codewords. Still further, any particular interleaving scheme may be used in order to physically separate bytes of one inner codeword. Still further, steps of the inventive process may be carried out in any order, as long as the previous step is not critical to the operation of the next step. For example, the data is preferably encoded into inner codewords after encoding the data into outer codewords. However, in an alternative embodiment of the present invention, the order is reversed.

Accordingly, it is to be understood that the invention is not to be limited by the specific illustrated embodiment, but only by the scope of the appended claims.

We claim:

1. A method for encoding data in an image block having a plurality of sub-blocks, each sub-block having a plurality of modules, each module representing a unit of the data, including the steps of:

encoding data in an outer error correction codeword;

recording the outer error correction codeword across the plurality of sub-blocks such that at least some of the modules within at least two of the sub-blocks, taken together, represent the entire outer error correction codeword;

encoding, in a first inner error correction codeword, part of the recorded outer error correction codeword;

recording the first inner error correction codeword in the same sub-blocks as the part of the outer error correction codeword that is used to encode the first inner error correction codeword;

encoding, in a second inner error correction codeword, part of the outer error correction codeword not encoded in the first inner error correction code; and recording the second inner error correction codeword in the same sub-blocks as the part of the outer error correction codeword that is used to encoded the second inner error correction codeword.

2. The method of claim 1, further including the step of:

interleaving the first and second error correction codewords such that parts of the first inner error correction codeword are spaced apart from other parts of the first inner error correction codeword, and parts of the second inner error correction codeword are spaced apart from other parts of the second inner error correction codeword.

3. The method of claim 2, wherein the parts of the first and second error correction codewords are symbols.

4. The method of claim 3, wherein the parts of the first and second error correction codewords are represented by individual modules.

5. The method of claim 1, wherein the inner error correction codeword is a Hamming codeword, and the outer error correction codeword is a Reed-Solomon codeword.

6. A method for encoding data in an image block having a plurality of sub-blocks, each sub-block having a plurality of modules, each module representing a unit of the data, including the steps of:

encoding, in a first outer error correction codeword, a first subset of a data file;

recording the first outer error correction codeword across some of the sub-blocks, such that at least some of the modules within at least two of the sub-blocks, taken together, represent the entire first outer error correction codeword;

encoding, in a next outer error correction codeword, a next subset of data;

recording the next error correction codeword across the sub-blocks, such that at least some of the modules within at least two of the sub-blocks, taken together, represent the entire next outer error correction codeword;

repeating the step of encoding a next subset and the step of recording a next subset for additional next subsets until the entire data file has been encoded and recorded;

encoding, in a first inner error correction codeword, part of at least some of the recorded outer error correction codewords; and recording the first inner error correction codeword in the same sub-blocks as the part of the outer error correction codeword that is used to encoded the first inner error correction codeword.

7. The method of claim 6, wherein the part of the outer error correction codeword recorded in any one sub-block is less than the codeword is capable of correcting.

8. The method of claim 7, wherein the entire inner codeword is recorded within one sub-block.

9. A method for encoding data in an image block having a plurality of sub-blocks, each sub-block comprising a plurality of modules, each module representing a unit of the data, including the steps of:

encoding, in a first outer error correction codeword, a first subset of a data file;

recording the first outer error correction codeword across the sub-blocks, such that at least some of the modules within at least two of the sub-blocks, taken together, represent the entire first outer error correction codeword;

encoding, in a next outer error correction codeword, a next subset of the data file;

recording the next error correction codeword across the sub-blocks, such that at least some of the modules within at least some of the sub-blocks, taken together, represent the entire next outer error correction codeword;

repeating the step of encoding a next subset and the step of recording a next subset for additional next subsets of the file data until all of the file data has been encoded and recorded;

encoding, in a first inner error correction codeword, the parts of those outer error correction codewords recorded in a first of the sub-blocks;

recording the first inner error correction codeword in the first of the sub-blocks;

encoding, in a next inner error correction codeword, the parts of recorded outer error correction codewords in a next of the sub-blocks;

recording the next inner error correction codeword in the next of the sub-blocks; and repeating the step of encoding in a next inner error correction codeword and the step of recording the next inner error correction codeword for each additional next one of the sub-blocks.

10. The method of claim 9, wherein the part of the outer error correction codeword recorded in any one sub-block is less than the codeword is capable of correcting.

11. The method of claim 10, wherein the entire inner codeword is recorded within one sub-block.

12. A method for encoding data in an image block having a plurality of sub-blocks, each sub-block comprising a plurality of modules, each modules representing a unit of the data, including the steps of:

encoding, in a first outer error correction codeword, a first subset of a data file;

recording the first outer error correction codeword across the sub-blocks, such that at least some of the modules within each of the sub-blocks, taken together, represent the entire first outer error correction codeword;

encoding, in a next outer error correction codeword, a next subset of the data file;

recording the next error correction codeword across the sub-blocks, such that at least some of the modules within each of the sub-blocks, taken together, represent the entire next outer error correction codeword;

repeating the step of encoding a next subset and the step of recording a next subset for additional next subsets of the file data until all of the file data has been encoded and recorded;

encoding, in a first inner error correction codeword, the parts of those outer error correction codewords recorded in a first of the sub-blocks;

recording the first inner error correction codeword in the first of the sub-blocks;

encoding, in a next inner error correction codeword, the parts of recorded outer error correction codewords in a next of the sub-blocks;

recording the next inner error correction codeword in the next of the sub-blocks; and repeating the step of encoding in a next inner error correction codeword and the step of recording the next inner error correction codeword for each additional next subset of the data file.

13. The method of claim 12, further including the step of:

interleaving each inner error correction codeword such that predetermined portions of the each inner error correction codeword are spaced apart from other predetermined portions of the each inner error correction codeword belonging to the same inner error correction codeword.

14. Apparatus for encoding data in an image block having a plurality of sub-blocks, each sub-block comprising a plurality of modules, each modules representing a unit of the data, including:

first encoding means for receiving a first subset of a data file and encoding, in a first outer error correction codeword, the first subset of the data file;

first recording means, coupled to the first encoding means, for recording the first outer error correction codeword across the sub-blocks, such that at least some of the modules within each of the sub-blocks, taken together, represent the entire first outer error correction codeword;

second encoding means, for receiving a next subset of the data file and encoding, in a next outer error correction codeword, the next subset of the data file;

second recording means, coupled to the second encoding means, for recording the next error correction codeword across the sub-blocks, such that at least some of the modules within each of the sub-blocks, taken together, represent the entire next outer error correction codeword;

third encoding means, coupled to the first and second encoding means, for receiving each outer error correction codeword and encoding, in a first inner error correction codeword, the parts of those outer error correction codewords recorded in a first of the sub-blocks;

third recording means, coupled to the third encoding means, for recording the first inner error correction codeword in the first of the sub-blocks;

fourth encoding means, coupled to the first and second encoding means, for encoding, in a next inner error correction codeword, the parts of those recorded outer error correction codewords recorded in a next of the sub-blocks; and fourth recording means, coupled to the fourth encoding means, for recording the next inner error correction codeword in the next of the sub-blocks.

* * * * *